United States Patent [19]
Kuo et al.

[11] Patent Number: 5,670,426
[45] Date of Patent: Sep. 23, 1997

[54] METHOD FOR REDUCING CONTACT RESISTANCE

[75] Inventors: So Wen Kuo; Chia-Shiung Tsai, both of Hsin-chu, Taiwan

[73] Assignee: Taiwan Semiconductor Manufacturing Company Ltd., Hsin-Chu, Taiwan

[21] Appl. No.: 592,927

[22] Filed: Jan. 29, 1996

[51] Int. Cl.⁶ .................................................. H01L 21/28
[52] U.S. Cl. ..................... 437/195; 437/228; 156/651.1; 156/662.1
[58] Field of Search ..................... 457/195, 203, 457/228; 156/651.1, 662.1, 653.1

[56] References Cited

U.S. PATENT DOCUMENTS

| | | | |
|---|---|---|---|
| 5,270,256 | 12/1993 | Bost et al. | 437/195 |
| 5,409,861 | 4/1995 | Choi | 437/195 |
| 5,458,266 | 10/1995 | Tsai et al. | 156/662.1 |
| 5,560,857 | 10/1996 | Sakon et al. | 156/662.1 |

*Primary Examiner*—John Niebling
*Assistant Examiner*—Thomas G. Bilodeau
*Attorney, Agent, or Firm*—George O. Saile

[57] ABSTRACT

A method for substantially improving the electrical characteristics of contact surfaces in contact holes and via holes that are formed in semiconductor substrates is disclosed. The method involves, in particular, the introduction of an "after-etch" process, subsequent to the application of prior art methods of "main-etch," "over-etch," and "soft-etch" that are employed in opening holes in semiconductors, in general. The said process uses an isotropic dry etch assisted by argon gas ions in such a way that the area of the contact surfaces are increased manyfold through the formation of three-dimensional structures. It is shown that the resulting electrical contact resistance of the surfaces is reduced, and therefore, improved substantially.

52 Claims, 3 Drawing Sheets

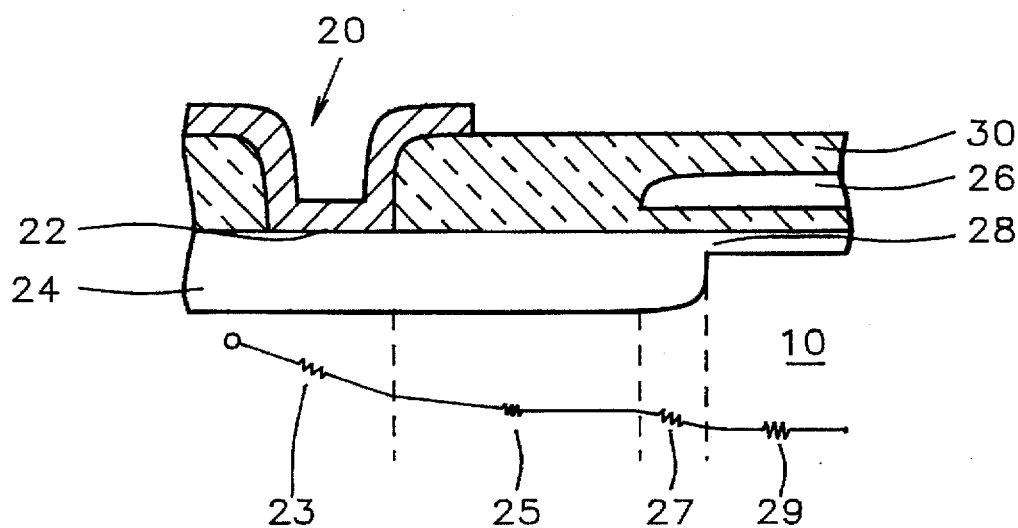
FIG. 1 - Prior Art
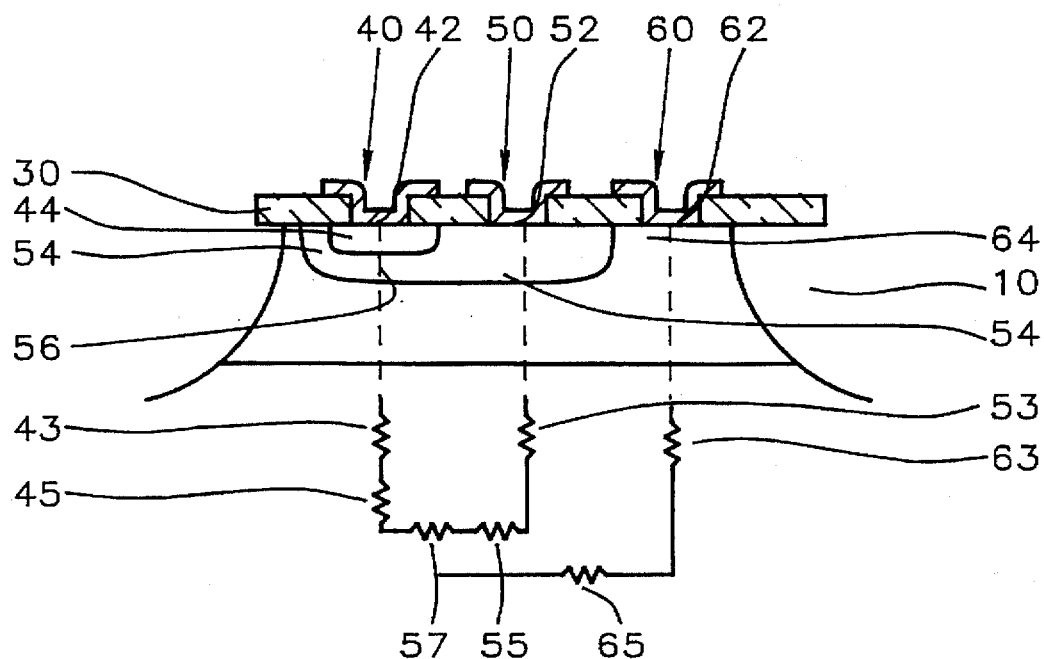
FIG. 2 - Prior Art

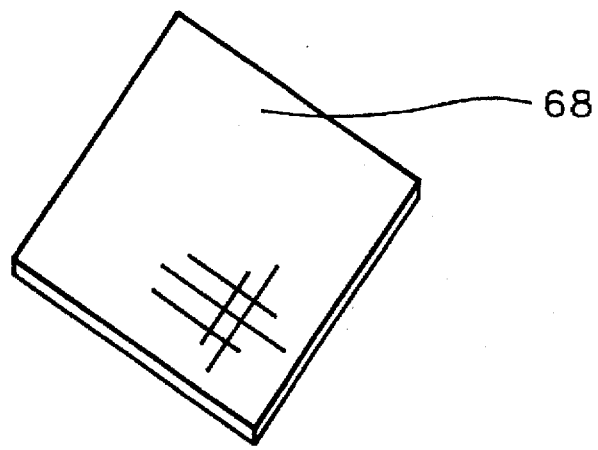
FIG. 3A – Prior Art
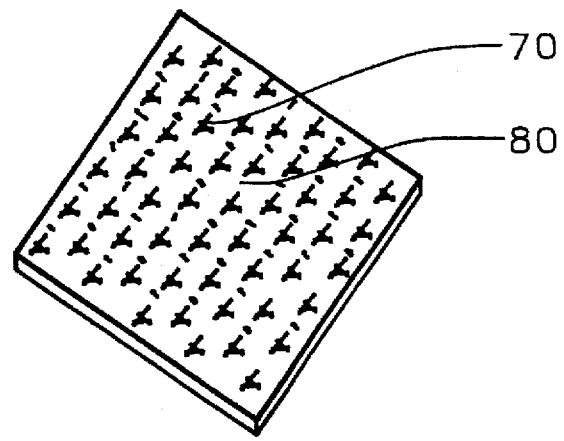
FIG. 3B
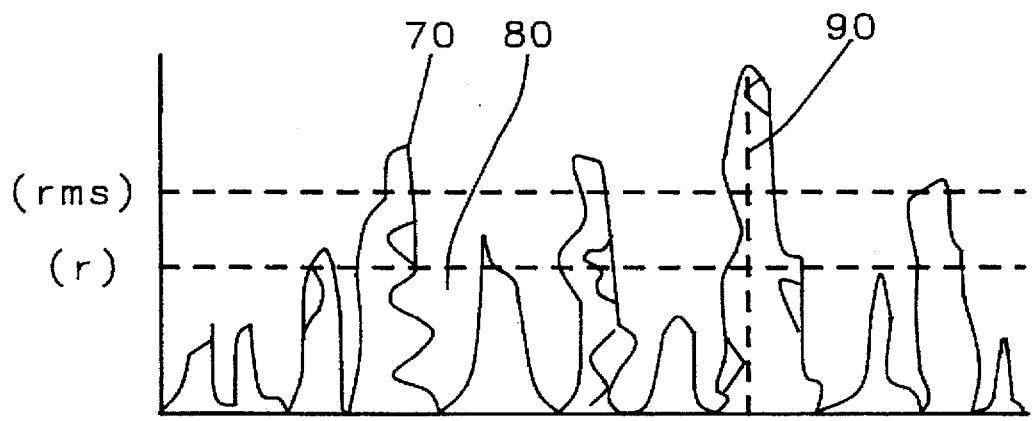
FIG. 4

METHOD FOR REDUCING CONTACT RESISTANCE

BACKGROUND OF THE INVENTION

(1) Field of the Invention

The present invention relates generally to semiconductors, and in particular, to substantially reducing contact resistance in interconnections by incorporating a specific etch step.

(2) Description of the Related Art

Semiconductor devices perform their functions only after they have been interconnected in a prescribed manner. The process of building the devices starts first by forming regions of field isolation in a silicon substrate. Then, in the MOS process, for example, a conductive gate is formed over a dielectric. The source and drain regions are heavily doped. Interlevel dielectric layers are deposited over these areas to serve as electrical insulators. Subsequently, holes are opened (e.g., etched) in the interlevel dielectric whereby metal deposited later into these holes form "contact-plugs" which contact the source, drain and gate regions. Depending upon the levels of integration of the integrated circuit chip, one or more metal layers with appropriate circuitized patterns are next deposited alternately with interlevel dielectric layers. Connections between the metal layers is provided through "via-plugs." In the highly dense, submicron integrated circuit (IC) devices, where small feature sizes are desired, 3 or 4 levels of interconnection metallization may be required.

The interconnections so formed through the "contact-plugs" or the "via-plugs" exhibit resistance (or impedance in the general case) to the flow of electric current through them. The nature of this electrical behavior can significantly impact the circuit performance of integrated circuits. Usually, the electrical resistance of the solid metal plugs themselves is small in comparison with the interfacial resistance that exists between the plugs and the contact surface that they are deposited on. When the contact surface is the silicon (Si) substrate, the interfacial or the contact resistance becomes a part of a parasitic resistance that exists in the path between the metal plug-to-Si substrate interface and the region in the device where the actual transistor action begins. This is readily seen when the physical structures of a planar MOSFET (metal-oxide-semiconductor field-effect-transistor) and a bipolar substrate (10) as shown in FIGS. 1 and 2, respectively, are examined. Following S. Wolf, et al., in their book "Silicon Processing for the VLSI Era", Vol. 2-Process Integration, published by Lattice Press, Sunset Beach, Calif., 1990, pp. 85-86, the transistor action in a MOSFET device occurs in the channel region under the gate (26) in FIG. 1. The current flowing from the metal plug region (20) to the channel region (28) is transported from the metal plug-Si contact (22) to the edge of the channel (28) through the source or drain regions (24). Region 30 is the interlevel dielectric in both Figures. In the planar bipolar transistor of FIG. 2, the emitter, base and collector regions are 44, 54 and 64, respectively, and the transistor action takes place in the intrinsic-base region (56). Regions 40, 50, 60 are the emitter, base and collector metal plug regions, respectively, and 42, 52, 62 are the respective metal plug-Si contact regions. Base current from the external circuit (not shown) is transported from the base contact (52) through the extrinsic-base region (54) to reach the intrinsic-base (56) in FIG. 2. In the MOSFET, the parasitic series resistance, $R_p$, of the current path from the contact (22) to the edge of the channel (28) is usually given by the sum of four components, $$R_p = R_{co} + R_{sh} + R_{sp} + R_{ac}$$

where $R_{co}$ (23) is the contact resistance of the contact surface (22) between the metal plug (20) and the source/drain region (24), $R_{sh}$ (25) is the sheet resistance of the bulk region of the source and drain, $R_{sp}$ (27) is the spreading resistance of the current from the channel end to the source, and $R_{ac}$ (29) is the accumulation-layer or the so-called, "crowding" resistance. It will be noted that the resistive circuits are shown symbolically in the lower portion of each of the FIGS. 1 and 2. In the planar bipolar transistor of FIG. 2, the series resistance of the base region, $R_B$, is the sum of the contact resistance $R_{co}$ (53), and the resistance of the current path of the extrinsic-base, $R_{B1}$, (55), and the intrinsic-base, $R_{B2}$ (57). Here again, the base current enters the base contact perpendicular to the substrate, and then flows horizontally in order to reach the intrinsic-base region (56). The emitter current experiences a series resistance that is basically due only to the contact resistance of the emitter contact (43) because the emitters are very shallow. Resistor 45 represents the emitter bulk resistance. In this case, the current flow is perpendicular to the substrate surface. Similar to the contact resistances, $R_{co}$, (43) and (53) of the emitter and base, the collector also has a contact resistance which is shown as (63) in FIG. 3(b). Resistor 65 in the same Figure represents the bulk resistance of the collector, which is shown for completeness.

It is clear from the brief description of the current flow in MOS and bipolar devices given above that in both cases the contact resistance, $R_{co}$, is always one of the parasitic-series-resistance components whenever metal-to-semiconductor contacts are made. Furthermore, it is usually the highest contributing component to the overall series resistance. It is also well known that the resistance to current flow in general is inversely proportional to the area normal to the flow, that is, $R_{co} \propto 1/A$ where A is the area. As semiconductor device dimensions shrink both vertically and laterally, if the contact areas also scale then the electrical resistance will increase accordingly. For a given surface of fixed boundaries, one way to increase the area (and hence to decrease the contact resistance) is to create folds or wrinkles on the surface. The present invention discloses a method for achieving such an enhanced silicon surface of increased area and the concomitant reduced contact resistance between the metal and the silicon substrate as shown in FIG. 3(b).

The formation of contact holes in the oxide that covers the substrate surface is a key step in the fabrication of contact structures. The said step starts by etching the oxide through the openings that are patterned on a mask that is formed on the oxide layer. Usually a photoresist serves as a mask, as is well known in the art, and will not be described here in order not to unnecessarily obscure the present invention. It is to be noted for completeness that the minimum size of the contact holes is usually determined by the minimum-resolution capability of the patterning technology. For holes larger than about 2.0 micrometers, wet etching is usually used to open them. Even with these relatively large holes it is found that it can be difficult to get the etchant into the holes because of the poor wettability conditions. Sometimes, due to the high aspect ratio of the holes, it can also be difficult to get into the holes to clean the reactant products subsequent to etching. The latter problem of unclean layers can contribute significantly to high contact resistances; because the layers of contaminants act as insulators between the metal that is to be later deposited into the hole and the contacting surface. This is especially true when the contacting surfaces are smooth. It will be appreciated that, surfaces with pointed wrinkles, as introduced in this invention, can more readily penetrate such layers of contaminants, thereby providing intimate electrical contact between the contacting surfaces.

To circumvent the said problems, as well as the isotropic nature of wet etching (which is ineffective for the patterning of smaller-sized contact holes) dry-etching processes have been developed as the "main-etch." Dry etching, however, has its own set of problems, including polymer contamination and damage to the silicon surface. Different recipes or parameters, and combinations of dry and wet etching have been devised to address these problems. One such main-etch recipe combines a dry-etch step to remove the first 80% of the contact oxide layer, and a buffered fluorine wet etch to etch the remainder of the oxide film. Another main-etch recipe uses gases with less propensity for forming polymeric products, and still another uses a more complex process for removing the polymers from contact holes after etch. S. Wolf in the same book cited above reports on another process that uses a dry-etch process to open contact holes, followed by a two-step dry-etch cleaning procedure to remove the residual damage. For contact holes of sizes less then one micrometer diameter, the main-etch is extended by "over-etching" in order to compensate for the decrease in etch rate for smaller contact dimensions. Finally, a "soft-etch" is performed as a final step for removing surface damage and contaminants.

Thus, in general, conventional contact etch recipe is comprised of three steps, namely, main-etch, over-etch and soft-etch. After the soft-etch, the silicon substrate surface in the contact hole becomes relatively clean and smooth. Any contaminants that are not removed lie on the smooth surface and at times, form crevices when metal is subsequently deposited into the contact hole. Therefore, most of the prior art provides contact areas which are only two-dimensional, that is, surfaces without any substantial amount of asperities or wrinkles.

In some other prior art, such as disclosed in U.S. Pat. No. 5,270,256, mention is made of the desirability of having a rough surface on silicon by removing the silicides that are formed during contact formation; but, without any specificity of the desired roughness, and with removal from only areas that are under a guard ring and not over contact areas. A method is disclosed in U.S. Pat. No. 5,409,861 whereby grooves are etched on a partially exposed metal layer prior to the formation of via plugs thereover for the purposes of increasing the adhesion strength and decreasing the electrical resistance of contacting surfaces in the via-plugs only. It is apparent that these prior art surfaces are essentially two-dimensional and relatively smooth, and are without the sufficient characteristics to offer consistently low electrical resistance.

SUMMARY OF THE INVENTION

It is therefore a primary object of this invention to provide a method for reducing the electrical resistance of conductive surfaces in contact holes in semiconductor substrates.

It is a further object of this invention to form contacting surfaces that are substantially of three-dimensional nature.

It is still another object of this invention to formulate an etch recipe that will accomplish the primary objective.

These objectives are accomplished by first forming contact holes in the oxide that covers the substrate surface by employing conventional methods including main-etch, over-etch and soft-etch. The soft-etch is then followed by an "after-etch" of a specific recipe during which the exposed silicon surface underneath the oxide becomes wrinkled with many asperities that are three-dimensional. Metal is deposited into the holes and etched back to form contact-plugs. An interconnect metal layer is then deposited and patterned followed by a dielectric layer. Subsequently, via holes are etched through the interlevel dielectric thus exposing the interconnect metal below. Following the prior art methods, metal is further deposited into the holes to form via-plugs. The latter process steps are repeated as needed for the particular multilayer integrated circuit chip technology. It will be appreciated that while the electrical characteristics of the surfaces subjected to the after-etch process are enhanced, the mechanical strength of joints formed over the same will have also been improved.

BRIEF DESCRIPTION OF THE DRAWINGS

FIG. 1 is a cross-section of a prior art planar MOSFET and the corresponding representation of the series resistance of the components.

FIG. 2 is a cross-section of prior art bipolar transistors and the corresponding representation of the series resistance of the components.

FIG. 3(a) is a polished prior art semiconductor wafer.

FIG. 3(b) is a semiconductor wafer after having been treated by an "after-etch" process of the invention.

FIG. 4 is a schematic drawing of a representative section of the surface topography of the wafer of the invention shown in FIG. 3(b).

DESCRIPTION OF THE PREFERRED EMBODIMENTS

Figure 5:
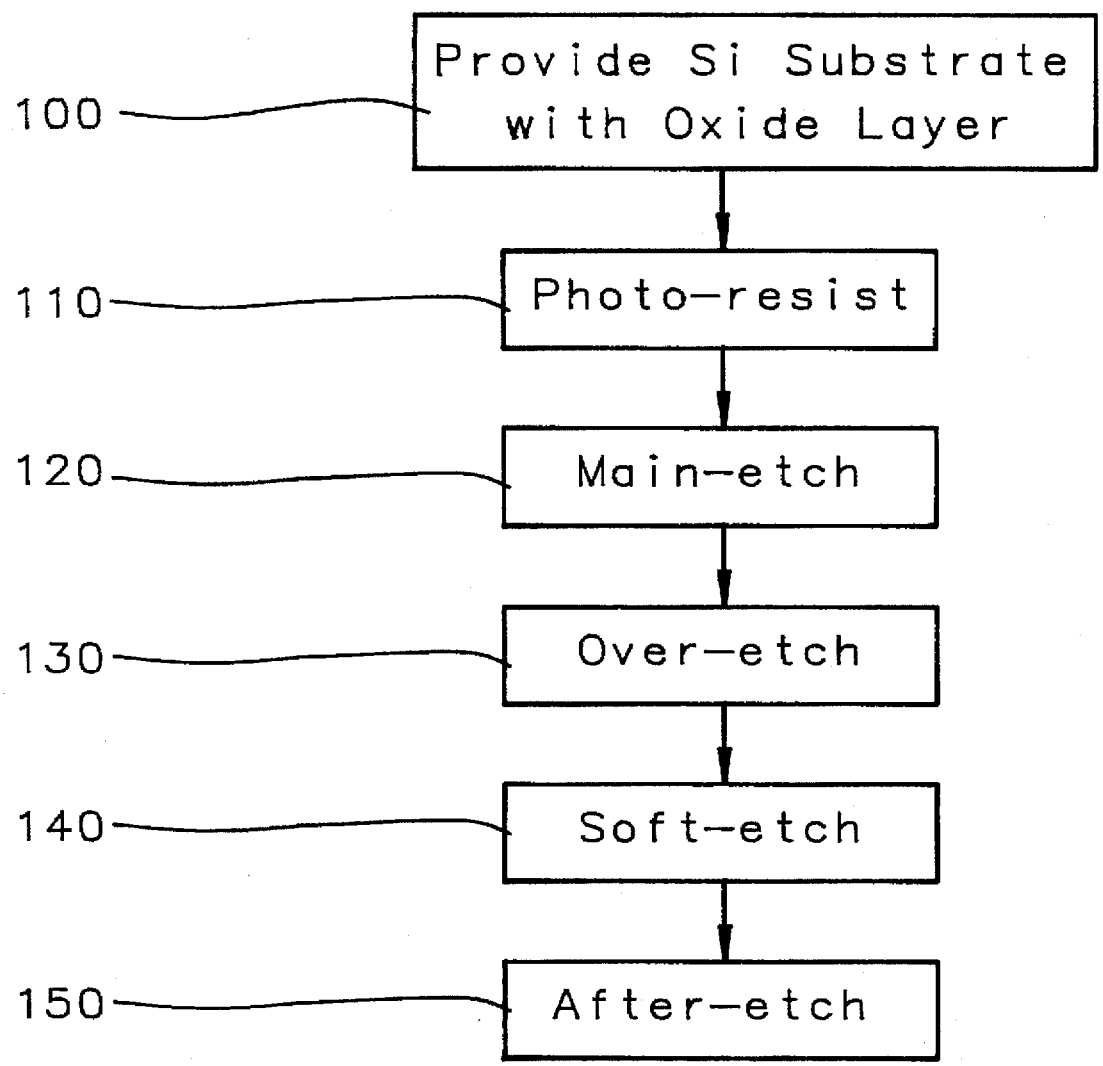
FIG. 5 is a process flow chart of this invention showing the incorporation of the "after-etch" step into conventional etch steps.

Referring now to FIG. 1 of prior art, a cross-section of a planar MOSFET substrate (10) is shown where region 26 is the gate, region 24, the source or drain, and 28 is the channel under the gate. These regions are formed by methods well known in the art and as they are not significant to the invention, will not be described in detail here. It is sufficient to note that the substrate in FIG. 1 has been subjected to many different process steps including field isolation, gate definition, source/drain implants and contact definition. Region 30 is the interlevel dielectric serving as an insulator layer between conducting layers.

Similarly, in FIG. 2 of prior art, the regions 44, 54 and 64 are the emitter, base and collector of a bipolar transistor which are formed by methods well known in the art, and will not be described in detail here. Region 20 in FIG. 1 and regions 40, 50 and 60 in FIG. 2 represent the metal contact-plugs. The present invention discloses a method to improve the metal-silicon (Si) contact surfaces 22 in FIG. 1, and surfaces 42, 52 and 62 in FIG. 2 for the purposes of reducing the contact resistance $R_{co}$, which is represented symbolically by the resistor 23 in FIG. 1, and resistors 43, 53 and 63 in FIG. 2, respectively. The other resistor symbols 29, 27, 25 in FIG. 1 represent symbolically the crowding, spreading, sheet bulk resistances corresponding to the physical region 28, enlarging region from 28 to 24 and region 24, respectively. Similarly, resistors 45 and 65 represent the bulk resistances of the emitter (44) and collector (64) regions, respectively and 55, 57 the intrinsic and extrinsic resistances of the base regions 56 and 54, respectively. It will be noted that resistances other than the metal-Si resistances are not significant to the invention, and therefore are included here for completeness only.

In FIG. 3(a), a topography (68) of the silicon surface is shown, which is very smooth. The hills (70) and valleys (80)

in FIG. 3(b) depict the roughness of a silicon surface that has been subjected to a special treatment of "after-etch." Generally, the roughness of a surface is given by a roughness-height index value; a number which equals the arithmetical average deviation of the minute surface irregularities from a hypothetical perfect surface, expressed in either microinches or in micrometers in SI units as stated in "Mark's Standard Handbook for Mechanical Engineers," Ninth Edition, edited by Eugene A. Availone, et al., published by McGraw-Hill, Inc., 1987, p. 13–79. Another measure often used is the root-mean-square (rms), which is obtained by squaring the height ordinates (90) in FIG. 4, finding their average value and extracting the square root. Tracer-point analyzers provide an effective and rapid means for determining the roughness values. Either one of these measurements can then be related to a radius, r, of a representative area which is repeated n times. Thus, in FIG. 3(a), the measured $(rms)_{a/s}$ height of asperities on a standard silicon surface is approximately 1.44 Angstroms (Å) with a corresponding representative radius, $(r)_{a/s}$ of about 0.468 Å.

In FIG. 3(b), the respective values for the specially treated silicon surface are $(rms)_{b/s}$=3.06 Å, and $(r)_{b/s}$=0.984 Å. Since the contact resistance $R_{co}$ is inversely proportional to the area A, and $A=\pi r^2 n$ for n such representative areas, it follows that $$R_{co/a}R_{co/b}=(r_b^2.n_b)/(r_a^2.n_a), \text{ or}$$

$$R_{co/a}/R_{co/b}=(0.984/0.486)^2.(n_b/n_a)$$

$$R_{co/a}/R_{co/b}=4.5 \ (n_b/n_a)$$

For the same normalized number of areas n, the contact resistance for the untreated silicon is then 4.5 times that of the treated silicon surface. Actually, methods and instrumentation are available which will directly yield the measured surface areas. One such method utilizes the BET (Brunauer, Emmett and Teller) equation in conjunction with a surface area and asperity-volume analyzer instrument. Basically, a single layer of gas is adsorbed on the surface. Knowing the cross-sectional area of the gaseous molecule, the surface area covered is readily calculated from the equation. Optical methods may also be used to measure the area of irregular surfaces with the aid of a Scanning Electron Microscope (SEM).

As stated previously, regions 70 and 80 in FIG. 3(b) and in the three-dimensional cross-section of FIG. 4 depict the hills and valleys that are formed on the silicon surface after a specific treatment step. The said step starts after the completion of the conventional three steps shown in FIG. 5; namely, after main-etch (120), over-etch (130) and soft-etch (140) that are performed through a photo-resist mask (110) provided on a silicon substrate with oxide layer (100). After the soft-etch, the silicon substrate surface in the contact hole becomes relatively clean and smooth. In the present invention, a specific "after-etch" step is introduced after the soft-etch. The processing parameters for this etch recipe can be varied and still achieve a substantially increased area on the three-dimensional surface. A list of the parameters that may be changed, the range of values for those parameters, and reasons for the selected ranges are as follows:

a. Environment. Inert gas Argon (Ar) is used with any one of the fluorinated reactive gases as the plasma. This sputter etch environment requires between about 100 standard cubic centimeter (sccm) to 250 sccm of argon gas. Below the lower limit, the etched surfaces are not highly three-dimensional. Above the upper limit, the asperities become weak, causing debris and other contaminants on the silicon surface.

b. Temperature. The processing temperature is in between about 30° C. to 80° C. When the temperature is too low, there will not be significant amount of silicon reaction with the plasma gas. Too high a temperature will cause photo-resist flow.

c. Pressure. The reactor pressure can be varied from 700 to 800 millitorr. A plasma may not be struck below the pressure limit. The result is that there will not be any significant etching of the silicon surface. The upper limit is dictated by excessive isotropic etch.

d. Power. The power can be set between about 50 to 100 watts. A plasma may not be struck below the power limit with the result that there will not be significant etching of the silicon. Above the upper limit, contaminant particles from the plasma chamber walls may be dislodged and deposited on the silicon surface. These and other polymers act as insulators and increase the electrical contact resistance between the silicon and the metal plugs that are to be deposited later.

e. Time. This is the most important parameter in determining the desired topography of the three-dimensional surface that is generated in the "after-etch" process. The reaction times can be varied depending upon the surface roughness that is being sought. However, beyond 130 seconds, the throughput of the equipment becomes limiting.

While the invention has been particularly shown and described with reference to the preferred embodiments thereof, it will be understood by those skilled in the art that various changes in form and details may be made without departing from the spirit and scope of the invention. For instance, the same procedures described here for MOS fabrication are just as applicable to the fabrication of bipolar semiconductors.

What is claimed is:

1. A method of forming an electrically enhanced contact surface in a contact hole on a semiconductor substrate comprising the steps of:

providing a silicon substrate over which is formed a blanket oxide layer overlying regions including FET devices therein;

performing a main-etch of said oxide layer through patterned photo-resist mask deposited on the oxidelayer to form contact holes;

performing an over-etch of said oxide layer through said mask;

performing soft-etch of exposed silicon in said contact holes through said mask;

performing after-etch of said silicon through said mask thereby increasing the surface area of said silicon; and depositing metal in said holes to form contact-plugs.

2. The method of claim 1, wherein the main-etch is a dry plasma etch.

3. The method of claim 2, wherein the gas of said plasma is fluorinated.

4. The method of claim 2, wherein the temperature of said plasma is in between about 30° C. temperature to 80° C.

5. The method of claim 2, wherein the pressure of said plasma is in between about 5 mT to 20 mT.

6. The method of claim 2, wherein the power for said plasma is in between about 80 watts to 120 watts.

7. The method of claim 2, wherein the time of said plasma etch is in between about 90 to 120 seconds.

8. The method of claim 1, wherein the over-etch time is in between about 40 to 60 seconds.

9. The method of claim 1, wherein soft-etch is an isotropic etch.

10. The method of claim 9, wherein the time of the said isotropic etch is 30 to 50 seconds.

11. The method of claim 1, wherein the after-etch is a dry plasma etch.

12. The method of claim 11, wherein said plasma is ion-assisted with argon gas.

13. The method of claim 12, wherein the flow rate of said argon gas is in between about 100 to 250 sccm.

14. The method of claim 11, wherein the temperature of said plasma is in between about 30° C. to 100° C.

15. The method of claim 11, wherein the pressure of said plasma is in between about 700 mT to 800 mT.

16. The method of claim 11, wherein the power for said plasma is in between about 50 watts to 100 watts.

17. The method of claim 11, wherein the time of said plasma etch is in between about 90 to 130 seconds.

18. A method of forming an electrically enhanced contact surface in a contact hole on a semiconductor substrate comprising the steps of:

providing a silicon substrate over which is formed a blanket oxide layer overlying regions including bipolar devices therein;

performing a main-etch of said oxide layer through patterned photo-resist mask deposited on the oxidelayer to form contact holes;

performing an over-etch of said oxide layer through said mask;

performing soft-etch of exposed silicon in said contact holes through said mask;

performing after-etch of said silicon through said mask thereby increasing the surface area of said silicon; and depositing metal in said holes to form contact-plugs.

19. The method of claim 18, wherein the main-etch is a dry plasma etch.

20. The method of claim 19, wherein the gas of said plasma is fluorinated.

21. The method of claim 19, wherein the temperature of said plasma is in between about 30° C. temperature to 100° C.

22. The method of claim 19, wherein the pressure of said plasma is in between about 5 mT to 20 mT.

23. The method of claim 19, wherein the power for said plasma is in between about 80 watts to 120 watts.

24. The method of claim 19, wherein the time of said plasma etch is in between about 90 to 120 seconds.

25. The method of claim 18, wherein the over-etch time is in between about 40 to 60 seconds.

26. The method of claim 18, wherein soft-etch is an isotropic etch.

27. The method of claim 26, wherein the time of the said isotropic etch is 30 to 50 seconds.

28. The method of claim 18, wherein the after-etch is a dry plasma etch.

29. The method of claim 28, wherein said plasma is ion-assisted with argon gas.

30. The method of claim 28, wherein the temperature of said plasma is in between about 30° C. to 100° C.

31. The method of claim 28, wherein the pressure of said plasma is in between about 700 mT to 800 mT.

32. The method of claim 28, wherein the power for said plasma is in between about 50 watts to 100 watts.

33. The method of claim 28, wherein the time of said plasma etch is in between about 90 to 130 seconds.

34. A method for fabricating a submicron semiconductor integrated IC device comprising: forming individual semiconductor devices within and on a semiconductor substrate; and forming a multilayer metallurgy structure over and connected to said devices to produce said IC semiconductor device; forming a photo-resist mask on a silicon dioxide layer already deposited over said devices; performing main-etch, over-etch, soft-etch on said oxide layer to form contact holes followed by after-etch where the soft-etch is performed on exposed silicon, and the after-etch increases the surface area of said silicon; depositing metal into said holes to form contact-plugs; further depositing metal to form interconnect layer; covering said metal layer with interlevel dielectric and then etching through the dielectric over a mask to form via holes; further depositing metal in said via holes to form via-plugs; further depositing metal to form another interconnect layer.

35. The method of claim 34, wherein the main-etch is a dry plasma etch.

36. The method of claim 35, wherein the gas of said plasma is fluorinated.

37. The method of claim 35, wherein the temperature of said plasma is in between about 30° C. temperature to 80° C.

38. The method of claim 35, wherein the pressure of said plasma is in between about 5 mT to 20 mT.

39. The method of claim 35, wherein the power for said plasma is in between about 80 watts to 120 watts.

40. The method of claim 35, wherein the time of said plasma etch is in between about 90 to 120 seconds.

41. The method of claim 34, wherein the over-etch time is in between about 40 to 60 seconds.

42. The method of claim 34, wherein soft-etch is an isotropic etch.

43. The method of claim 42, wherein the time of the said isotropic etch is 30 to 50 seconds.

44. The method of claim 34, wherein the after-etch is a dry plasma etch.

45. The method of claim 44, wherein said plasma is ion-assisted with argon gas.

46. The method of claim 45, wherein the flow rate of said argon gas is in between about 100 to 250 sccm.

47. The method of claim 44, wherein the temperature of said plasma is in between about 30° C. to 100° C.

48. The method of claim 44, wherein the pressure of said plasma is in between about 700 mT to 800 mT.

49. The method of claim 44, wherein the power for said plasma is in between about 50 watts to 100 watts.

50. The method of claim 44, wherein the time of said plasma etch is in between about 90 to 130 seconds.

51. The method of claim 34, wherein the metal which is deposited in said contact holes is etched back to form the contact-plug.

52. The method of claim 34, wherein metal is deposited in said via holes to form the another interconnect layer.

* * * * *